US006951299B2

(12) United States Patent
Lee et al.

(10) Patent No.: US 6,951,299 B2
(45) Date of Patent: Oct. 4, 2005

(54) TOOLING FRAME ABLE TO ADHERE TO TIN

(75) Inventors: Ming-Jer Lee, Taoyuan (TW); Chih-Ju Yen, Tainan Hsien (TW)

(73) Assignee: SUSTeK Computer Inc., Taipei (TW)

( * ) Notice: Subject to any disclaimer, the term of this patent is extended or adjusted under 35 U.S.C. 154(b) by 431 days.

(21) Appl. No.: 10/260,392

(22) Filed: Oct. 1, 2002

(65) Prior Publication Data

US 2003/0089614 A1 May 15, 2003

(30) Foreign Application Priority Data

Nov. 13, 2001 (TW) ....................................... 90219499 U

(51) Int. Cl.[7] .............................................. B23K 37/00
(52) U.S. Cl. ..................................... 228/35; 228/49.5
(58) Field of Search ............................ 228/4.1, 19–23, 228/33–41, 44.7, 49.1, 49.5

(56) References Cited

U.S. PATENT DOCUMENTS

| | | | | | |
|---|---|---|---|---|---|
| 3,684,151 | A | * | 8/1972 | Burman et al. ................ 228/19 |
| 4,311,266 | A | * | 1/1982 | Kondo ......................... 228/40 |
| 4,462,532 | A | * | 7/1984 | Davis et al. ................... 228/40 |
| 4,474,322 | A | * | 10/1984 | Aldous ......................... 228/36 |
| 4,577,398 | A | * | 3/1986 | Sliwa et al. ............. 228/123.1 |
| 4,740,099 | A | * | 4/1988 | Philipoussi .................... 403/2 |
| 4,819,327 | A | * | 4/1989 | Tatsuoka et al. ............... 29/840 |
| 4,891,472 | A | * | 1/1990 | Veurman et al. ............ 174/250 |
| 4,942,843 | A | * | 7/1990 | Shireman et al. .............. 118/74 |
| 6,335,664 | B1 | * | 1/2002 | Sangawa et al. ............ 333/128 |
| 6,592,021 | B2 | * | 7/2003 | Sangawa et al. ............ 228/259 |
| 2002/0047038 | A1 | * | 4/2002 | Sangawa et al. ......... 228/122.1 |
| 2003/0089614 | A1 | * | 5/2003 | Lee et al. .................... 205/125 |

* cited by examiner

*Primary Examiner*—Kiley S. Stoner
(74) *Attorney, Agent, or Firm*—Birch, Stewart, Kolasch & Birch, LLP

(57) ABSTRACT

A tooling frame with an ability to adhere to tin is disclosed, which is a frame structure used to support a circuit board passing through a stannic furnace to be soldered. The tooling frame is characterized in that a tin adhesive apparatus having a tin adhesive material is mounted at an appropriate location of the tooling frame so as to suck surplus tin on said circuit board both after the circuit board is transported through the stannic furnace for tin filling and during tin shedding and to improve quality of soldering.

13 Claims, 2 Drawing Sheets

TOOLING FRAME ABLE TO ADHERE TO TIN

FIELD OF THE INVENTION

The present invention relates to a frame structure for supporting a circuit board which passes through a stannic furnace to be soldered, more particularly, to a tooling frame having an ability to adhere to tin.

BACKGROUND OF THE INVENTION

With the rapid advances in the integrated circuit (IC) packaging technology and the great promotion of operation performance, not only multi-media computers are widely favored by consumers, but also popularization of computers and the related peripheral products are accelerated. However, because of improvements in IC's operation performance, the number of the packaging contact pins of various components is also greatly increased. This leads that the related circuit board layout design becomes more sophisticated and complicated and that the manufacturing processes for plugging and tin soldering of circuit boards meet with considerable difficulties. In current production procedures in assembly of circuit boards, the manufacturing process for tin soldering the contact pins of the chips is mainly by means of wave soldering, wherein the molten liquid tin inside the stannic furnace is gushed up by a pump as a long tin wave and when the circuit board is obliquely transported upwardly through the stannic furnace and makes contact with the tin wave, the liquid tin will enter into the holes where the contact pins of the chip are plugged in the circuit board, fill the tin therein, and form weld spots thereon.

Please refer to FIG. 1, which is a schematic diagram of a bottom view of a conventional tooling frame, including a main frame 10 which is a frame structure designed in accordance with the shape and dimension of a circuit board 12. The surface 14 of the circuit board 12 to be soldered faces downward to a stannic furnace (not shown) and the rims of the circuit board 12 are held on the main frame 10 to expose the soldering region of the circuit board 12 from the hollow portion in the middle of the main frame 10. Hence, the conventional tooling frame has merely one major function that is to support the circuit board 12 so as to prevent the circuit board 12 from bending or deforming when transferred through the stannic furnace for wave soldering. However, it is found that in the process of wave soldering, the output yield of the circuit board 12 through the stannic furnace is much concerned with contact pins 18 of a chip 16. Especially, when the number of contact pins 18 of the chip 16 become more and the arrangement thereof grow denser, the weld spot formed at the rear area of the contact pin 18 of the chip 16, as shown by the arrow in FIG. 2 which is a side view of part of the conventional tooling frame, is more liable to has the defects such as tin bridge or poor tin filling etc.

Although the above-mentioned problems may be later remedied by operators to remove the tin bridge and poor filling tin in order to maintain the soldering quality of the circuit board, such an action not only increases labor costs, but also the quality of circuit boards becomes uncontrollable due to the human factor. Therefore, the manufacturers of circuit boards are devoted to development and improvement in the producing and manufacturing processes in order to greatly decrease the probability of tin bridge and poor tin filling defects occurred at the weld spots of the contact pins of the circuit board during the wave soldering, and to enhance the soldering quality of circuit boards as well as to reduce labor costs.

SUMMARY OF THE INVENTION

The primary objective of the present invention is to provide a tooling frame which is able to adhere to tin and thus can reduce the occurrence of tin bridge and poor tin filling defects in circuit boards so as to raise the soldering quality of circuit boards.

In one embodiment of this invention, the tooling frame with an ability to adhere to tin comprises a main frame which is a frame structure designed based on the shape and dimension of a circuit board. The rims of the circuit board are carried on the main frame. The surface of the circuit board to be soldered is faced downward to a stannic furnace and the soldering region of the circuit board is exposed from the hollow portion in the middle of the main frame, so that the liquid tin may enter into the hole where a contact pin of a chip is plugged in the circuit board, fill the tin therein when the circuit board is transported through the stannic furnace, and form a weld spot thereon.

The feature of this invention resides in that the tooling frame has a tin adhesive apparatus with a tin adhesive material mounted on the inner side of the main frame. The tin adhesive apparatus is a plate structure which is extended inwardly from the side of the main frame to the contact pin of the chip of the circuit board. A slant is formed at the end portion of the plate structure inclining from the lower edge of the plate structure toward the base portion of the contact pin.

The tin adhesive apparatus and the main frame may be assembled as a whole, or may be combined with each other in the manner of bolting, welding or pasting and so on.

The tin adhesive apparatus of this invention can suck surplus tin both after the circuit board is transported through the stannic furnace for tin filling and during tin shedding, and thus can decrease the undesired tin bridge or poor tin filling and improve the output yield of the stannic furnace. Therefore, this invention can save labor costs and enhance quality of products.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

A tooling frame having an ability to adhere to tin of this invention is disclosed, wherein a tin adhesive apparatus having a tin adhesive material mounted thereon can suck surplus tin on the contact pins of the chips after the circuit board is transported through the stannic furnace for tin filling, so that the undesired tin bridge or poor tin filling taken place at the surface of the circuit board will be avoided and the soldering quality of the circuit board can be enhanced. The detailed description of the present invention is given by the following best mode for illustration.

Figure 3:
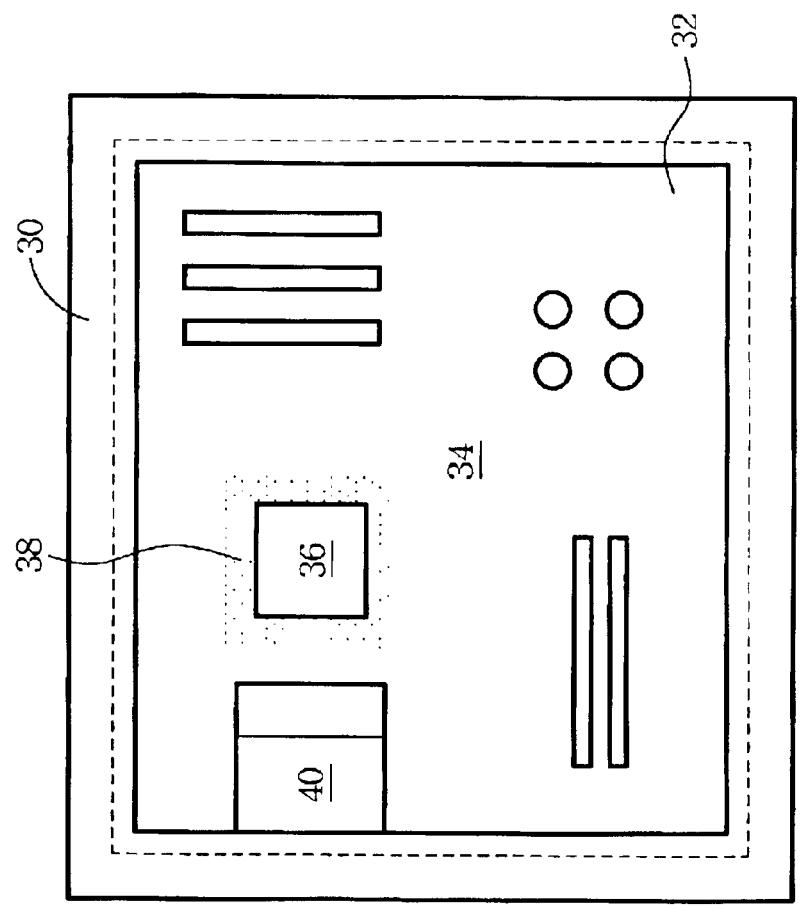
FIG. 3 is a schematic diagram of a bottom view of a tooling frame having an ability to adhere to tin in accordance with the present invention.

Please refer to FIG. 3, which is a schematic diagram of a bottom view of a tooling frame having an ability to adhere to tin in accordance with the present invention. The tooling frame comprises a main frame 30 designed in accordance with the shape and dimension of a circuit board 12. The rims of the circuit board 32 are held on the main frame 30. The surface 34 of the circuit board 32 to be soldered is faced downward to a stannic furnace (not shown) and the soldering region of the circuit board 32 is exposed from the hollow portion in the middle of the main frame 30, so that the liquid tin may enter into the hole where a contact pin 38 of a chip 36 is plugged in the circuit board 32, fill the tin therein, when the circuit board 32 is transported through the stannic furnace, and form a weld spot thereon.

Figure 2:
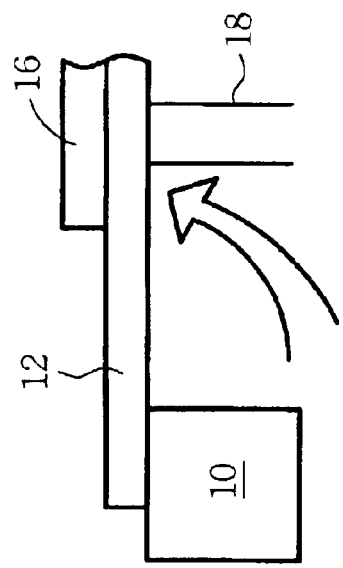
FIG. 2 is a side view of part of the conventional tooling frame in FIG. 1.
Figure 1:
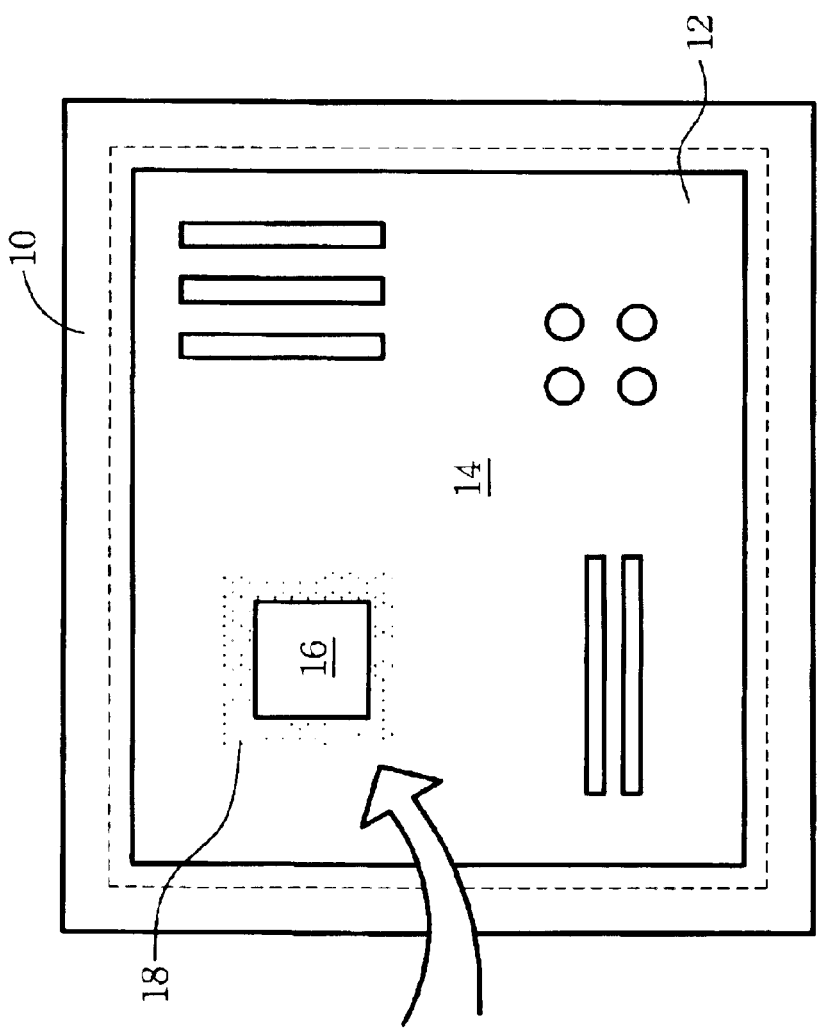
FIG. 1 is a schematic diagram of a bottom view of a tooling frame in the prior art.
Figure 4:
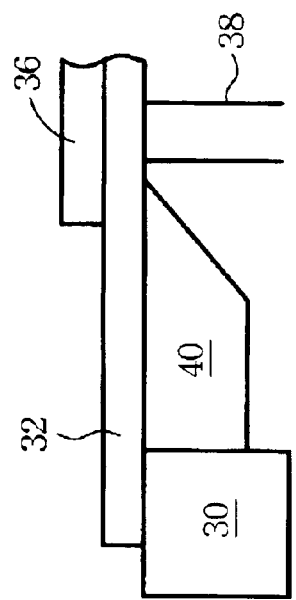
FIG. 4 is a side view of part of the tooling frame in FIG. 3.

A tin adhesive apparatus 40 with a tin adhesive material is mounted on the inner side of the main frame 30 of the tooling frame. The tin adhesive apparatus is a plate structure which is extended inwardly from the rear side of the main frame 30 to the contact pin 38 of the chip 36 of the circuit board 32. A slant is formed at the end portion of the plate structure inclining from the lower edge of the plate structure toward the base portion of the contact pin 38. The inclination of the slant is most preferably 30–60 degrees (as shown in FIG. 4).

The tin adhesive apparatus 40 and the main frame 30 may be assembled in a piece, or may be combined with each other in the manner of bolting, welding or pasting and so on. Moreover, the tin adhesive apparatus 40 may be produced with the tin adhesive material, or by electroplating the tin adhesive material onto the surface thereof. The tin adhesive material may be gold, silver, cupper or nickel element etc., or the alloy thereof. The tin adhesive material can suck surplus tin both after the circuit board 32 is transported through the stannic furnace for tin filling and during tin shedding, so as to decrease the undesired tin bridge or poor tin filling and to improve the output yield of the stannic furnace. Therefore, not only the labor costs can be saved, the quality of products but also can be enhanced.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed:

1. A tooling frame with an ability to absorb a surplus tin, which is a frame structure used to support a circuit board passing through a stannic furnace to be soldered, wherein: a tin adhesive apparatus having a tin adhesive material is mounted at an appropriate location of said tooling frame; whereby the surplus tin of said circuit board can be attached to said tin adhesive apparatus both after said circuit board is transported through said stannic furnace for tin filling and during tin shedding so as to improve quality of soldering, wherein said tooling frame comprises a main frame, and a plurality of rims of said circuit board are held on said main frame, and the soldering region of the surface of said circuit board to be soldered is exposed from a hollow portion in the middle of said main frame, and said tin adhesive apparatus is a plate structure extended inwardly from at least one side of said main frame to a plurality of contact pins of chips of said circuit board.

2. The tooling frame of claim 1, wherein a slant is formed at one end portion of said plate structure inclining from the lower edge of said plate structure toward the base portion of said contact pin.

3. The tooling frame of claim 1, wherein said tin adhesive apparatus and said main frame are assembled in a piece and said tin adhesive material is electroplated onto the surface of said tin adhesive apparatus.

4. The tooling frame of claim 1, wherein said tin adhesive apparatus and said main frame are combined with each other in a manner selected from bolting, welding and pasting.

5. The tooling frame of claim 1, wherein said tin adhesive material comprises a group selected from gold, silver, copper, nickel, and the alloy thereof.

6. The tooling frame of claim 2, wherein said slant formed at said end portion of said plate structure inclines at an angle of 30–60 degrees.

7. A tooling frame with an ability to adhere to tin, which is a frame structure used to support a circuit board passing through a stannic furnace to be soldered, said tooling frame comprises:

a main frame, which is designed based on the shape and dimension of said circuit board and the rims of said circuit board are held on said main frame, and the soldering region of the surface of said circuit board to be soldered is exposed from the hollow portion in the middle of said main frame; and a tin adhesive apparatus, which is a plate structure made of a tin adhesive material and mounted on the rear side of said main frame, extended inwardly to contact pins of chips of said circuit board so as to suck surplus tin produced at said contact pins both after said circuit board is transported through said stannic furnace for tin filling and during tin shedding.

8. The tooling frame of claim 7, wherein a slant is formed at one end portion of said plate structure inclining from the lower edge of said plate structure toward the base portion of said contact pin.

9. The tooling frame of claim 7, wherein said tin adhesive apparatus and said main frame are assembled in a piece.

10. The tooling frame of claim 7, wherein said tin adhesive apparatus and said main frame are combined with each other in a manner selected from bolting, welding and pasting.

11. The tooling frame of claim 7, wherein said tin adhesive material comprises a group selected from gold, silver, copper, nickel, and the alloy thereof.

12. The tooling frame of claim 8, wherein said slant formed at said end portion of said plate structure inclines at an angle of 30–60 degrees.

13. The tooling frame of claim 1, wherein said main frame is designed based on the shape and dimension of said circuit board.

* * * * *

UNITED STATES PATENT AND TRADEMARK OFFICE
CERTIFICATE OF CORRECTION

PATENT NO. : 6,951,299 B2  
DATED : October 4, 2005  
INVENTOR(S) : Chih-Ju Yen et al.

It is certified that error appears in the above-identified patent and that said Letters Patent is hereby corrected as shown below:

<u>Title page,</u>
Item [73], Assignee, should read -- ASUSTeK Computer Inc., Taipei (TW) --.

Signed and Sealed this

Twenty-eighth Day of February, 2006

JON W. DUDAS
*Director of the United States Patent and Trademark Office*